(12) United States Patent
Trassl (10) Patent No.: US 11,058,010 B2
(45) Date of Patent: Jul. 6, 2021

(54) EVAPORATION APPARATUS FOR DEPOSITING MATERIAL ON A FLEXIBLE SUBSTRATE AND METHOD THEREFORE

(71) Applicants: Applied Materials, Inc., Santa Clara, CA (US); Roland Trassl, Giessen (DE)

(72) Inventor: Roland Trassl, Giessen (DE)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 16/318,812

(22) PCT Filed: Aug. 1, 2016

(86) PCT No.: PCT/EP2016/068327
§ 371 (c)(1),
(2) Date: Jan. 18, 2019

(87) PCT Pub. No.: WO2018/024313
PCT Pub. Date: Feb. 8, 2018

(65) Prior Publication Data
US 2019/0246504 A1      Aug. 8, 2019

(51) Int. Cl.
*C23C 14/00*       (2006.01)
*H05K 3/14*        (2006.01)
(Continued)

(52) U.S. Cl.
CPC ......... *H05K 3/146* (2013.01); *C23C 14/0021* (2013.01); *C23C 14/027* (2013.01); *C23C 14/562* (2013.01); *H05K 1/118* (2013.01)

(58) Field of Classification Search
CPC .............................. C23C 14/0021; C23C 14/24
See application file for complete search history.

(56) References Cited

U.S. PATENT DOCUMENTS

| 2004/0129220 A1* | 7/2004 | Saitoh ................. C23C 16/5096 |
| | | 118/723 E |
| 2004/0139914 A1* | 7/2004 | Yamazaki ............... C23C 14/24 |
| | | 118/719 |
| 2013/0280840 A1* | 10/2013 | Sonoda ............. H01L 21/02263 |
| | | 438/34 |

FOREIGN PATENT DOCUMENTS

| CN | 105378136 A | 3/2016 |
| DE | 19845268 C1 | 1/2000 |

(Continued)

OTHER PUBLICATIONS

International Search Report and Written Opinion for Application No. PCT/EP2016/068327 dated Apr. 18, 2017.

(Continued)

*Primary Examiner* — Joseph A Miller, Jr.
(74) *Attorney, Agent, or Firm* — Patterson + Sheridan LLP (57) ABSTRACT

An evaporation apparatus (100) for depositing material on a flexible substrate (160) supported by a processing drum (170) is provided. The evaporation apparatus includes: a first set (110) of evaporation crucibles aligned in a first line (120) along a first direction for generating a cloud (151) of evaporated material to be deposited on the flexible substrate (160); and a gas supply pipe (130) extending in the first direction and being arranged between an evaporation crucible of the first set (110) of evaporation crucibles and the processing drum (170), wherein the gas supply pipe (130) includes a plurality of outlets (133) for providing a gas supply directed into the cloud of evaporated material, and wherein a position of the plurality of outlets is adjustable for changing a position of the gas supply directed into the cloud of evaporated material.

15 Claims, 5 Drawing Sheets

(51) Int. Cl.
*C23C 14/02* (2006.01)
*C23C 14/56* (2006.01)
*H05K 1/11* (2006.01)

(56) References Cited

FOREIGN PATENT DOCUMENTS

| | | | |
|---|---|---|---|
| JP | H06-122958 | A | 5/1994 |
| JP | H10-329262 | A | 12/1998 |
| JP | 2001192808 | A | 7/2001 |
| JP | 20011921808 | * | 7/2001 |
| JP | 2001260266 | A | 9/2001 |
| JP | 2001279425 | A | 10/2001 |
| JP | 2007119916 | A | 5/2007 |
| JP | 2007261134 | A | 10/2007 |
| JP | 2013234364 | A | 11/2013 |
| WO | 2014207088 | A1 | 12/2014 |

OTHER PUBLICATIONS

European Patent Application No. 16753613.5, Communiation pursuant to Article 94(3) EPC dated May 1, 2020, 6 pages.
Chinese Application No. 201680088171.1, First Office Action and Search Report dated Jun. 23, 2020, 12 pages.
Japanese Application No. 2019-505240, Office Action dated Jan. 19, 2021 with English Translation, 6 pages.

* cited by examiner

EVAPORATION APPARATUS FOR DEPOSITING MATERIAL ON A FLEXIBLE SUBSTRATE AND METHOD THEREFORE

TECHNICAL FIELD

The present disclosure relates to an evaporation apparatus for depositing material on a flexible substrate. In particular, embodiments of the present disclosure relate to an evaporation apparatus including an evaporation crucible for evaporating material to be deposited on the flexible substrate. More particularly, embodiments of the present disclosure relate to an evaporation apparatus including an evaporation crucible and a gas supply.

BACKGROUND

Depositing thin layers on a flexible substrate is a production process for many applications. The flexible substrates are coated in one or more chambers of a flexible substrate coating apparatus. The flexible substrates, such as foils made of plastics or pre-coated papers, are guided on rolls or drums and pass in this way the source of deposition material. Possible applications of the coated substrate range from providing coated foils for the packaging industry to depositing thin films for flexible electronics and advanced technology applications, such as smartphones, flat screen TVs and solar panels.

Different deposition processes may be used to achieve a layer with the desired properties. For instance, in a thermal evaporation process, thin layers of aluminum are metallized onto flexible substrates. Substrates coated in such a way may for instance be used for the production of protective packaging or decorative materials. In further processes, such as in reactive coating processes, gas is supplied to the substrate additionally to an evaporated material from the material source in order to provoke a chemical reaction influencing the layer deposited on the substrate. By using such processes, several characteristics of the substrate may be controlled, such as barrier characteristics for water vapor or oxygen, and transparency characteristics of the finished product.

For the finished product, it is desirable to have a reliable and optically acceptable layer on the substrate in order to have a product of high quality. At the same time, the productivity of the deposition process has to be considered in so far as a slow process yielding a high quality product may not be acceptable for a customer due to the costs increasing with the production time. In known systems, the number of material sources may be adapted in order to improve the productivity, the guiding drums for the substrates may be adapted (such as cooled, or positioned in a suitable way) in order to achieve desired layer properties, and a control unit may monitor and optimize the process to avoid irregularities in the process operation.

However, irrespective of the measures taken, irregularities may still appear in the optical appearance of the coated substrate or the integrity of the coating, which is not acceptable in the case of packaging industry or decorative foils. In view of the above, embodiments of the present disclosure aim at providing an evaporation apparatus and a method therefore that overcome at least some of the problems in the art.

SUMMARY

In view of the above, an evaporation apparatus for depositing material on a flexible substrate and a method of manufacturing a gradient layer according to the independent claims are provided. Further advantages, features, aspects and details are apparent from the dependent claims, the description and drawings.

According to one aspect of the present disclosure, an evaporation apparatus for depositing material on a flexible substrate supported by a processing drum is provided. The evaporation apparatus includes: a first set of evaporation crucibles aligned in a first line along a first direction for generating a cloud of evaporated material to be deposited on the substrate; and a gas supply pipe extending in the first direction and being arranged between an evaporation crucible of the first set of evaporation crucibles and the processing drum. The gas supply pipe includes a plurality of outlets for providing a gas supply directed into the cloud of evaporated material. Further, the evaporation apparatus is configured such that a position of the plurality of outlets is adjustable for changing a position of the gas supply directed into the cloud of evaporated material.

According to another aspect of the present disclosure, a method for manufacturing a gradient layer having a first composition and a second composition is provided. The method includes evaporating material with the first composition from a first set of evaporation crucibles aligned in a first line along a first direction such that a cloud of evaporated material is generated for depositing the material on a flexible substrate supported by a processing drum; providing a gas supply directed into the cloud of evaporated material through a plurality of outlets of a gas supply pipe for generating the second composition; and adjusting a gradient of the second composition of the gradient layer by adjusting a position of the gas supply directed into the cloud of evaporated material.

According to a further aspect of the present disclosure, a gradient layer having a first composition and a second composition, particularly wherein the first composition is aluminum Al and the second composition is aluminum oxide AlOx, produced by a method according to any of the embodiments of the present disclosure is provided.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. In the following, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Before the embodiments of the present disclosure are described in more detail in the following, some terms and expressions used herein are explained.

In the present disclosure, a "flexible substrate" may be understood as a substrate that is bendable. In particular, a flexible substrate as referred to herein may be understood as a substrate suitable for being coated in an evaporation apparatus, in particular in a reactive evaporation apparatus. For example, the flexible substrate may be a foil or a web, e.g. foil or a web made of or containing plastics and polymers (such as polypropylene, PET substrates, substrates made of or containing OPP, BOPP, CPP, PE, LDPE, HDPE, OPA, PET), pre-coated paper, or biodegradable films (such as PLA).

In the present disclosure, the term "processing drum" is to be understood as a roller which is used during processing of a flexible substrate as described herein. In particular, a "processing drum" is to be understood as a roller which is configured to support a flexible substrate during processing. More specifically, the processing drum as described herein may be arranged and configured such that the flexible substrate, e.g. a foil or a web, is wound around at least a part of the processing drum. For instance, during processing, typically the flexible substrate is in contact with at least a lower portion of the processing drum. In other words, during processing, the flexible substrate is wound around the processing drum such that the flexible substrate is in contact with a lower portion of the processing drum and the flexible substrate is provided below the processing drum.

In the present disclosure, the term "evaporation crucible" is to be understood as a reservoir for the material to be evaporated by heating the evaporation crucible. More specifically, an evaporation crucible as described herein may be equipped with a material supply for delivering the material to be evaporated to the crucibles. For example, the material to be evaporated may be supplied to the evaporation crucible in the form of a wire which may be melted by the evaporation crucible, particularly an evaporator boat as described herein. Accordingly, the crucibles described herein may be configured for heating the material delivered to the crucibles to the melting and further to the evaporation temperature of the respective material to be evaporated.

In the present disclosure, a "gas supply pipe" is to be understood as a pipe arranged and configured for providing a gas supply into a space between an evaporation crucible, particularly a set of evaporation crucibles, and a processing drum. For instance, the gas supply pipe may be positioned and/or shaped so as to direct a gas supply into a cloud of evaporated material between a first set of evaporation crucibles and the processing drum. Typically, the gas supply pipe includes openings or outlets which are arranged and configured such that the gas supply from the gas supply pipe can be directed into the cloud of evaporated material. For instance, the openings or outlets may have at least one shape selected from the group consisting of a circular shape, a rectangular shape, an oval shape, a ring-like shape, a triangular-like shape, a polygon-like shape, or any shape suitable for delivering gas into the cloud of evaporated material.

Figure 1:
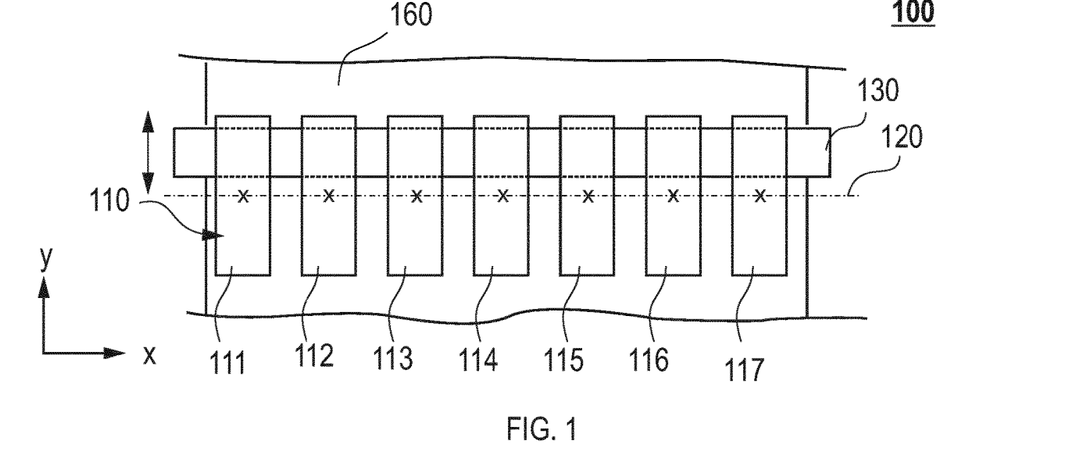
FIG. 1 shows a schematic top view of an evaporation apparatus according to embodiments described herein.
Figure 2:
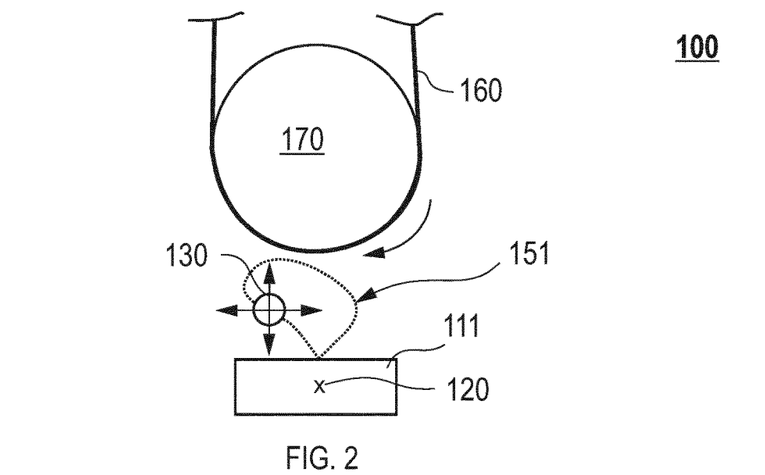
FIG. 2 shows a schematic front view of the evaporation apparatus shown in FIG. 1.
Figure 3:
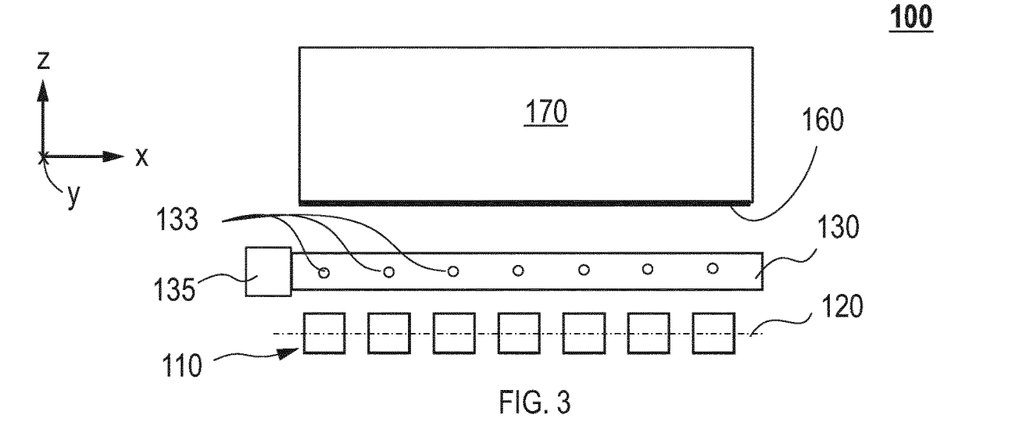
FIG. 3 shows a schematic side view of the evaporation apparatus shown in FIG. 1.

FIGS. 1 to 3 show an evaporation apparatus 100 according to embodiments described herein for depositing material on a flexible substrate 160 supported by a processing drum 170.

In particular, as exemplarily shown in FIGS. 1 and 2, according to embodiments which can be combined with any other embodiments described herein, the evaporation apparatus 100 includes a first set 110 of evaporation crucibles aligned in a first line 120 along a first direction, e.g. along the x-direction shown in FIG. 1, for generating a cloud 151 of evaporated material to be deposited on the flexible substrate 160. With exemplary reference to FIG. 1, typically the flexible substrate 160 moves in the y-direction during the deposition process. The first set 110 of evaporation crucibles shown in FIG. 1 exemplarily includes crucibles 111 to 117. Further, as exemplarily shown in FIG. 3, the evaporation apparatus 100 includes a gas supply pipe 130 extending in the first direction and being arranged between the first set 110 of evaporation crucibles and the processing drum 170. As exemplarily shown in FIG. 3, typically the gas supply pipe 130 includes a plurality of outlets 133 for providing a gas supply directed into the cloud 151 of evaporated material. Further, as indicated by the double arrows in FIG. 2, the evaporation apparatus is configured such that a position of the plurality of outlets is adjustable for changing a position of the gas supply directed into the cloud of evaporated material.

For instance, according to embodiments which can be combined with any other embodiments described herein, the evaporation apparatus 100 may be configured such that the position of the gas supply directed into the cloud 151 of evaporated material may be changed within the z-y-plane, as exemplarily shown in FIG. 2. Alternatively, the position of the gas supply directed into the cloud of evaporated material may also be changed by a rotation of the gas supply around the first direction, e.g. the x-direction shown in FIG. 2, such that the radial position of the outlets for providing the gas supply can be changed.

In the present disclosure, the expression "a position of the plurality of outlets is adjustable for changing a position of the gas supply" is to be understood in that the evaporation apparatus is configured such that at least two different positions of the gas supply provided through the outlets can be realized. For instance, the evaporation apparatus may include a fixation arrangement configured for fixing a first position of the gas supply pipe and for fixing a second position of the gas supply pipe which is different form the first position. In particular, the at least two different positions are located between the processing drum and the evaporation crucibles, as exemplarily described with reference to FIGS. 4A, 5A, 7 and 8. For example, the fixation arrangement may include two or more releasable connections, e.g. screw connections, which are provided at two or more different preselected positions. Accordingly, it is to be understood that the position of the gas supply directed into the cloud of evaporated material may be adjusted by remounting the gas supply pipe from a first position to two or more preselected positions which are different form the first position. Additionally or alternatively, the position of the gas supply directed into the cloud of evaporated material may be adjusted by rotating the supply pipe around the longitudinal axis of the supply pipe from a first radial position to a second radial position, such that in the second radial position the outlets are provided at a different position than in the first radial position.

Additionally or alternatively, the fixation arrangement may include one or more elongated holes in which a fixation element of the gas supply pipe can be guided and fixed in order to change and adjust various positions of the gas supply pipe. Accordingly, according to embodiments which can be combined with any other embodiments described herein, the evaporation apparatus may include a fixation arrangement which is configured for providing at least two different positions for fixation of the gas supply pipe, such that the gas supply directed into the cloud of evaporated material may be changed, e.g. by rotation of the gas supply pipe around the longitudinal axis of the gas supply pipe or translation of the gas supply pipe within the z-y-plane as exemplarily described with reference to FIGS. 2, 4A and 5A.

Accordingly, an evaporation apparatus as described herein may be beneficial for the production of gradient layers having a first composition and a second composition. In particular, by providing an evaporation apparatus which is configured such that a position of the gas supply directed into the cloud of evaporated material can be adjusted (e.g. by changing the position of the plurality of outlets of the gas supply pipe within the cloud of evaporated material), the amount and position of the second composition of the gradient layer generated by reaction of the supplied gas with the evaporated material of first composition can be adjusted.

Accordingly, an evaporation apparatus can be provided in which physical properties, such as barrier properties or optical properties, of a gradient layer can be controlled and adjusted. For instance, the evaporation apparatus as described herein may advantageously be employed for the production of an aluminum (Al)/aluminum oxide (AlOx) gradient layer on a flexible substrate. Particularly, the evaporation apparatus as described herein may be used for depositing aluminum (Al) as the first composition of the gradient layer, e.g. for providing barrier properties, and aluminum oxide (AlOx) as the second composition of the gradient layer, e.g. for providing surface hardness of the gradient layer. Further, with the evaporation apparatus as described herein, the gradient of aluminum (Al)/aluminum oxide (AlOx) can be adjusted. Accordingly, the evaporation apparatus as described herein provides for controlling and adjusting the thickness of a first composition (e.g. Al) of the gradient layer, the thickness of a second composition (e.g. AlOx) of the gradient layer, as well as the thickness of a transition region from the first composition to the second composition.

Further, it is to be understood that the gradient layer may appear in different colors. In particular, the color of the gradient layer may depend on the layer thickness, the refractive index of the gradient layer, and the stoichiometry of the gradient layer. Accordingly, for instance by controlling and adjusting the thickness of the first composition (e.g. Al) of the gradient layer, the thickness of the second composition (e.g. AlOx) of the gradient layer, as well as the thickness of a transition region from the first composition to the second composition, the optical appearance of the gradient layer can be controlled. For example, a gradient layer having a higher content of Al compared to AlOx may have a metallic appearance.

Accordingly, it is to be understood that the evaporation apparatus as described herein may be an evaporation apparatus for a reactive evaporation process. According to some embodiments, the herein described crucibles may be adapted for providing evaporated material on the substrate to be coated. For example, the crucibles may provide one component of the material to be deposited as a layer on the substrate. In particular, the crucibles described herein may include a metal, e.g. aluminum, which is evaporated in the crucibles. Further, the evaporated material from the crucibles may react with a further component, e.g. a reactive gas such as oxygen, in the evaporation apparatus for forming a gradient layer as described herein on the flexible substrate. Accordingly, the aluminum from the crucibles together with the oxygen provided through the outlets of the gas supply pipe as described herein may form a layer of AlOx and/or mixed layer of Al/AlOx on the flexible substrate in the evaporation apparatus according to embodiments described herein.

In view of the embodiments described herein, the skilled person understands that any material, specifically any metal, may be used as material in the crucibles as long as the vapor pressure of the material may be achieved by thermal evaporation. For instance, the material provided by the crucibles can be copper (Cu) and the gas provided by the gas supply pipe can be oxygen so as to form a copper oxide (CuOx) layer or a mixed layer of Cu/CuOx on the substrate.

Furthermore, a set of crucibles as referred to herein should be understood as a set of at least two crucibles. In particular, a set of crucibles may be described as being at least two crucibles aligned in a line. For instance, the line along which the crucibles of a crucible set are aligned may run through the center of the crucibles. In particular, the center of a crucible may be defined as the geometrical center of the crucible in the x-direction and in the y-direction, e.g. a center in the length and width direction of the crucible, as exemplarily shown in FIG. 1. According to further embodiments, the center of a crucible may be defined as being the center of gravity of the crucible.

In one embodiment, the crucibles in a set of crucibles may be of the same type or have substantially the same size. While not shown in the schematic views of the figures, the crucibles described herein may be equipped with a material supply for delivering the material to be evaporated by the crucibles to the crucibles. Further, the crucibles described herein may be configured for heating the material delivered to the crucibles to the melting and further to the evaporation temperature.

According to some embodiments, a crucible as described herein may also be comprised of an evaporator boat. For instance, an evaporator boat may include in one frame an arrangement of crucibles. In the embodiments described herein, a set of crucibles may for instance also be a set of evaporator boats. In one example, a set of evaporator boats may include two evaporator boats being arranged along a line. However, for the sake of a better overview, such evaporator boats are also referred to as a crucible. According to some embodiments, the term "crucible" is synonymously used for the term "evaporation crucible."

With exemplary reference to FIGS. 1 to 3, according to embodiments which can be combined with any other embodiments described herein, the first line 120 of the first set 110 of evaporation crucibles is defined through the center of at least two of the crucibles in the first set of crucibles and the position of the gas supply is adjustable in a second direction being different from the first direction. For example, the second direction can be any direction in the z-y-plane, as exemplarily shown in FIG. 2. According to a particular embodiment which can be combined with any other embodiments described herein, the second direction may be perpendicular to the first line 120. More specifically, the second direction can be a horizontal direction, such as the y-direction shown in FIG. 2. The y-direction shown in FIG. 2 typically corresponds to the substrate transport direction. Accordingly, it is to be understood that according to embodiments described herein, the position of the gas supply is adjustable with respect to the first line 120 along which the first set 110 of evaporation crucibles are aligned. In the front view of FIG. 2, the first line 120 along which the first set 110 of evaporation crucibles are aligned is indicated by a cross.

During processing, the flexible substrate 160 is subjected to the material evaporated by the first set 110 crucible set as indicated by the cloud 151 of evaporated material, as exemplarily shown in FIG. 2. Further, during processing, a gas supply is directed into the cloud 151 of evaporated material through a plurality of outlets 133 of the gas supply pipe 130, such that a portion of the evaporated material may react with the supplied gas. Accordingly, the flexible substrate 160 is further subjected to evaporated material which has been reacted with the supplied gas such that during processing, the flexible substrate 160 is coated with a layer including the material evaporated by the crucibles and the gas supplied by the gas supply pipe, e.g. in the form of reactive products of the components provided by the crucible and the gas supply pipe.

According to embodiments which can be combined with any other embodiments described herein, the evaporation apparatus may further include a positioning device 135, as exemplarily shown in FIG. 3. In particular, the positioning device 135 can be configured for adjusting the position of the gas supply pipe 130 for adjusting the position of the gas supply directed into the cloud of evaporated material. For instance, the positioning device 135 may be configured to move the gas supply pipe in any direction within the y-z-plane, as exemplarily shown in FIG. 2. Additionally or alternatively, the positioning device 135 may be configured such that the gas supply pipe may be rotated around the longitudinal axis of the gas supply pipe, e.g. extending in the x-direction, such that the radial position of the outlets provided in the supply pipe may be adjusted such that a position of the gas supply directed into the cloud of evaporated material through the outlets can be changed. Accordingly, by providing an evaporation apparatus having a positioning device 135 as described herein, the position of the gas directed into the cloud of evaporated material can be adjusted, which may be beneficial for controlling and adjusting the properties of a gradient layer as described herein. In particular, the positioning device 135 may include a fixation arrangement as described herein.

According to some embodiments which can be combined with any other embodiment described herein, the positioning device may include a positioning mechanism which is configured for positioning the supply pipe within a plane perpendicular to the longitudinal extension of the supply pipe. Additionally or alternatively, the positioning mechanism may be configured for rotating the supply pipe around the longitudinal axis of the supply pipe. The positioning mechanism can be a manual mechanism or a powered mechanism, e.g. an electrically driven mechanism for example by employing electric actuators.

In particular, according to embodiments which can be combined with any other embodiments described herein, the position of the gas supply is adjustable within a plane being perpendicular to the first direction. Typically, the position of the gas supply is adjustable within a positioning range of ±80 mm relative to an initial position of the gas supply pipe, particularly within a positioning range of ±60 mm, more particularly within a positioning range of ±40 mm. Accordingly, it is to be understood that the position of the gas supply is adjustable with respect to an initial position within a radius of 0 mm-80 mm, particularly within a radius of 0 mm-60 mm, more particularly within a radius of 0 mm-40 mm. For example, the initial position may be a first position as described herein. In particular, with exemplary reference to FIG. 2, the positioning range may be a positioning area in the z-y-plane which is perpendicular to the x-direction, i.e. the longitudinal extension of the supply pipe. Accordingly, the positioning range may be a range in the y-direction and/or the z-direction, exemplarily shown in FIG. 2.

Figure 4A:
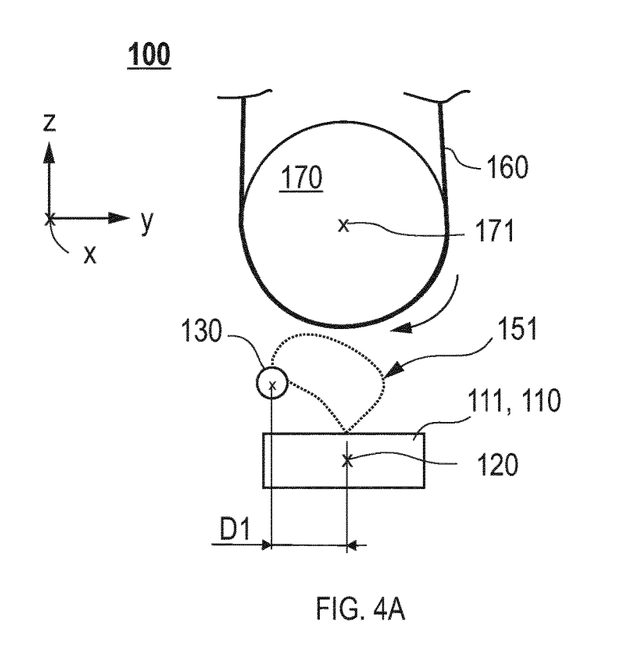
FIG. 4A shows a schematic front view of an evaporation apparatus according to embodiments described herein, wherein a gas supply is directed into the cloud of evaporated material in a lateral edge region between the processing drum and an evaporation crucible of the first set of evaporation crucibles.

FIG. 4A shows a schematic front view of an evaporation apparatus 100 according to embodiments described herein, wherein a gas supply is directed into the cloud of evaporated material in a lateral edge region between the processing drum 170 and the first set 110 of evaporation crucibles. In particular, as exemplarily shown in FIG. 4A, the gas supply pipe 130 extending in the first direction may be positioned in a lateral edge region between the first set 110 of evaporation crucibles and the processing drum 170, such that the gas supply is directed into a lateral edge region of the cloud 151 of evaporated material. Accordingly, by providing an evaporation apparatus which is configured for providing the gas supply into a lateral edge region of the cloud 151 of evaporated material, the amount of the second composition of the gradient layer generated by reaction of the supplied gas with the evaporated material of first composition can be decreased. This is exemplarily shown in the schematic sectional view of the gradient layer producible illustrated in FIG. 4B, in which the dark region represents the first composition, e.g. aluminum, of the gradient layer and the bright region represents the second composition, e.g. aluminum oxide, of the gradient layer.

Accordingly, it is to be understood that embodiments of the evaporation apparatus as described herein are configured for depositing a graded layer starting with a first composition, particularly a metallic composition such as aluminum Al, and ending with a second composition, particularly an oxidized metallic composition such as aluminum AlOx. Further, according to embodiments which can be combined with any other embodiment described herein, the stoichiometry of the oxidized metallic composition (e.g. AlOx) can be adjusted by the amount of oxygen directed into the cloud of evaporated material. Moreover, as can be seen by comparing FIGS. 4A and 4B with FIGS. 5A and 5B, in which the gas supply is directed into the cloud of evaporated material at different lateral positions (D1 and D2, respectively) with respect to the first line 120, the thickness of the oxidized metallic composition of the gradient layer can be adjusted by the position at which the gas supply is directed into the cloud of evaporated material. In particular, with a configuration of the evaporation apparatus in which the gas supply is directed into the cloud 151 of evaporated material in a central region between a rotational axis 171 of the processing drum 170 and the first set 110 of evaporation crucibles, as exemplarily shown in FIG. 5A, a gradient layer with an increased thickness of the second composition, e.g. of the oxidized metallic composition such as AlOx, can be deposited on a flexible substrate 160, as exemplarily shown in FIG. 5B.

For instance, a gradient layer having a gradient of a first composition and a second composition, e.g. an Al/AlOx gradient layer, with a thickness of the first composition (e.g. Al) of 40 nm followed by a thickness of the second composition (e.g. AlOx) of 10 nm-20 nm may be produced by directing the gas supply into the cloud of evaporated material in a lateral edge region between the processing drum 170 and the first set 110 of evaporation crucibles, as exemplarily shown in FIG. 4. Accordingly, beneficially a gradient layer with barrier properties can be provided, e.g. by an Al-composition, which is covered by a protective second composition, e.g. AlOx. Further, advantageously a gradient layer can be produced having improved durability and barrier properties wherein the optical appearance is like pure aluminum.

Figure 4B:
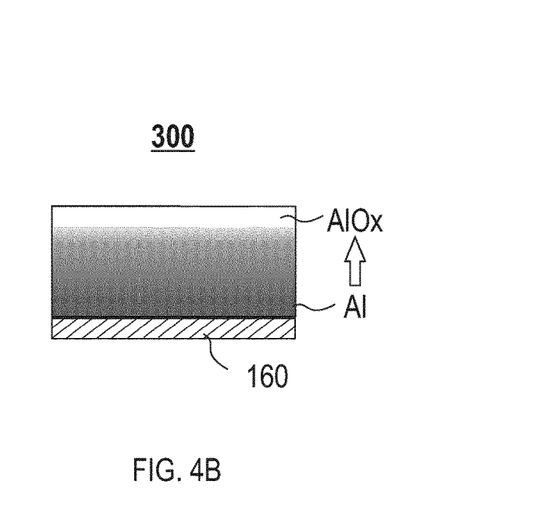
FIG. 4B shows an exemplary schematic sectional view of a gradient layer producible by the evaporation apparatus according to embodiments described herein, when a gas supply is directed into the cloud of evaporated material in a lateral edge region, as exemplarily shown in FIG. 4A, during production of the gradient layer.

In other words, the evaporation apparatus as described herein is configured such that the thickness of the individual compositions of a gradient layer may be controlled or adjusted by controlling and adjusting the position of the gas supply directed into the cloud of evaporated material, as shown in FIGS. 4A, 4B, 5A and 5B. For instance, by reducing the lateral position of the gas supply directed into the cloud 151 of evaporated material with respect to the first line 120 from a first position D1 to a second position D2, the thickness of the oxidized metallic composition such as AlOx of the gradient layer can be increased as can be seen by the comparison of FIGS. 4A and 4B with FIGS. 5A and 5B. Accordingly, embodiments of the evaporation apparatus are particularly well-suited for controlling and adjusting physical properties, e.g. barrier properties and/or optical properties, of a gradient layer deposited on a flexible substrate, particularly used in packaging applications.

Figure 5A:
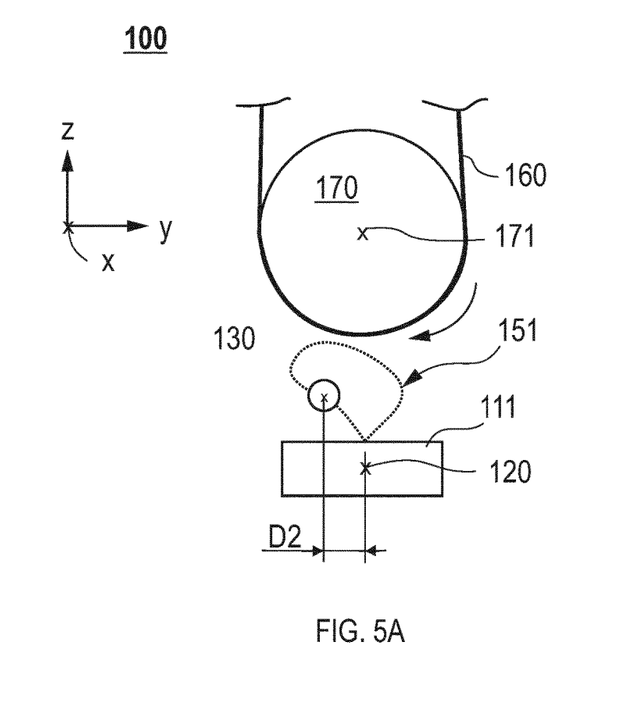
FIG. 5A shows a schematic front view of an evaporation apparatus according to embodiments described herein, wherein a gas supply is directed into the cloud of evaporated material in a central region between a rotational axis of the processing drum and an evaporation crucible of the first set of evaporation crucibles.
Figure 5B:
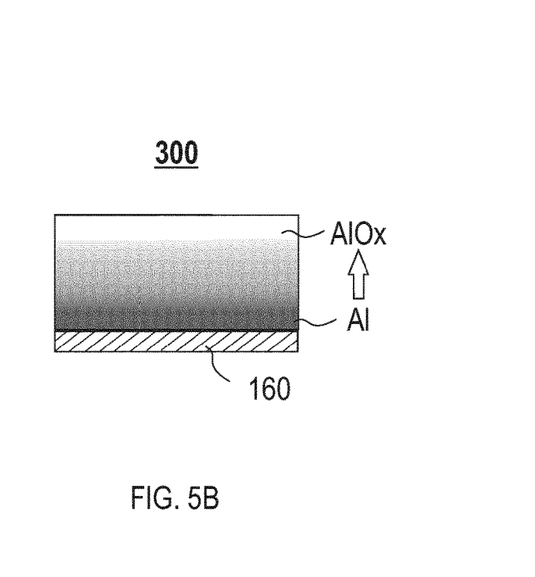
FIG. 5B shows an exemplary schematic sectional view of a gradient layer producible by the evaporation apparatus according to embodiments described herein, when a gas supply is directed into the cloud of evaporated material in a central region, as exemplarily shown in FIG. 5A, during production of the gradient layer.

For instance, a gradient layer having a gradient of a first composition and a second composition, e.g. an Al/AlOx gradient layer, with a thickness of the first composition (e.g. Al) of 40 nm followed by a thickness of the second composition (e.g. AlOx) of 100 nm-200 nm may be produced by directing the gas supply into the cloud of evaporated material in a central region between the rotational axis 171 of the processing drum 170 and the first set 110 of evaporation crucibles, as schematically shown in FIG. 5B. Accordingly, beneficially a gradient layer with barrier properties can be provided, e.g. by an Al-composition, which is covered by a protective second composition, e.g. AlOx. Further, advantageously a gradient layer can be produced having improved durability and barrier properties wherein also the optical color appearance can be adjusted by the thickness and the refractive index of the second composition, e.g. AlOx, provided in the gradient layer.

Figure 6:
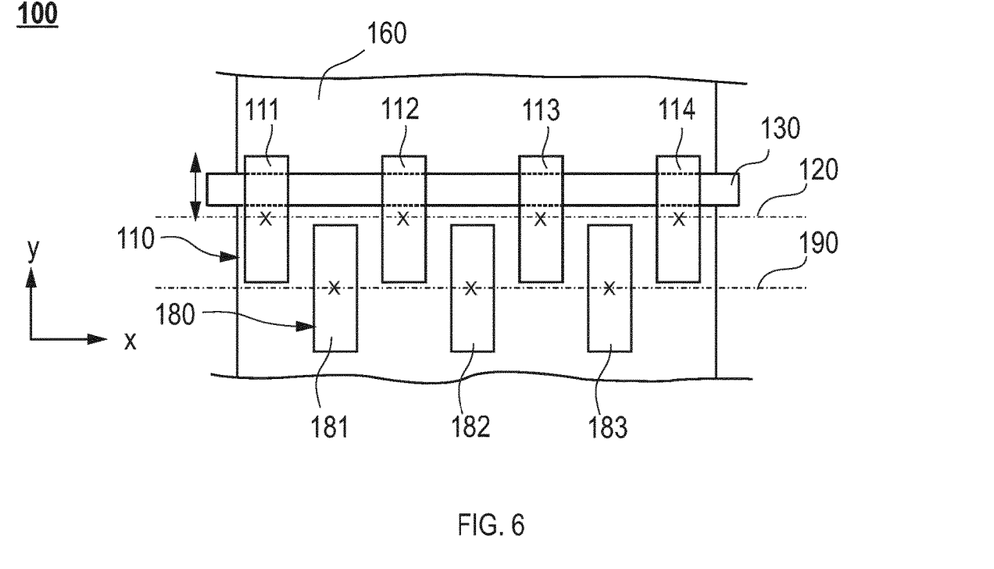
FIG. 6 shows a schematic top view of an evaporation apparatus according to further embodiments described herein.
Figure 7:
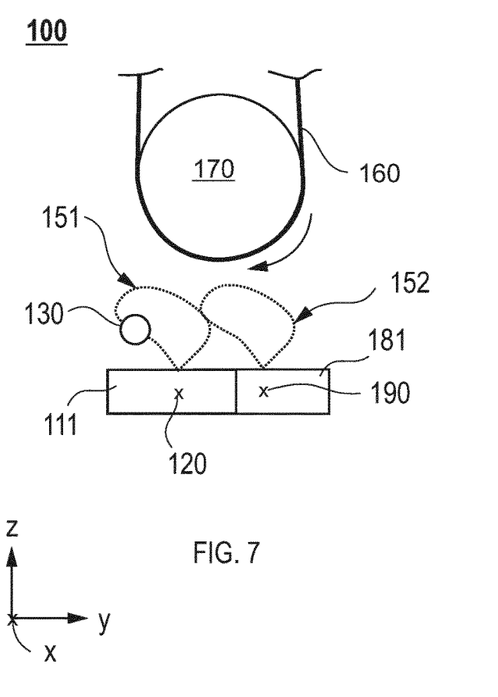
FIG. 7 shows a schematic front view of the evaporation apparatus shown in FIG. 6.
Figure 8:
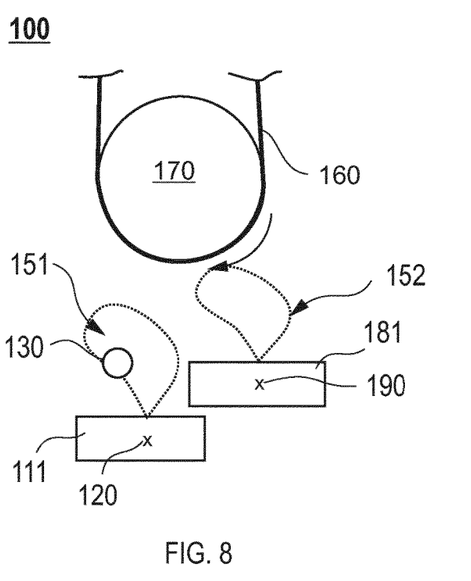
FIG. 8 shows a schematic front view of the evaporation apparatus according to yet further embodiments described herein.

With exemplary reference to FIGS. 6 to 8, according to embodiments which can be combined with any other embodiments described herein, the evaporation apparatus may further include a second set 180 of evaporation crucibles aligned in a second line 190 along the first direction for generating a further cloud 152 of evaporated material to be deposited on the flexible substrate 160. The second line 190 of the second set 180 of evaporation crucibles is defined through the center of at least two of the crucibles in the second set 180 of crucibles. The second set 180 of evaporation crucibles shown in FIG. 6 exemplarily includes crucibles 181 to 183, the center of which are indicated by crosses. The second line 190 runs through the centers of the crucibles 181, 182, and 183.

With exemplarily reference to FIG. 6, according to embodiments which can be combined with any other embodiments described herein, the first line 120 and the second line 190 are displaced with respect to each other, particularly horizontally displaced with respect to each other, in a direction substantially perpendicular to the first direction. For instance, the first line 120 and the second line 190 are displaced to each other displaced to each other in a range of between 20 mm and 90 mm, particularly between 40 mm and about 80 mm, more particularly between about 60 mm and about 80 mm. According to some embodiments, the first line 120 and the second line 190 are displaced to each other by equal to or more than 40 mm, particularly by equal to or more than 60 mm. As exemplarily shown in FIGS. 6 to 8, the gas supply pipe 130 is provided between the first set 110 of crucibles, e.g. crucibles 111 to 114, and the processing drum 170 supporting the flexible substrate 160. Although not explicitly shown in FIGS. 6 to 8, it is to be understood that the exemplary embodiments as described with reference to FIGS. 6 to 8 may also include a plurality of outlets 133 provided in the gas supply pipe 130 as well as a positioning device as described with reference to FIGS. 1 to 3.

In the exemplary embodiment of FIG. 6, the first set 110 of crucibles includes four crucibles, and the second set 180 of crucibles includes three crucibles. However, the number of crucibles shown in the figures described herein is an example for the sake of a better overview. For instance, the number of crucibles in the first set of crucibles and the second set of crucibles may be the same in one embodiment. The number of crucibles, either in the first set of crucibles or in the second set of crucibles, or in both, may typically be between 2 and 70, more typically between 2 and 40, and even more typically between 4 and 20. In one example, the first set of crucibles includes two crucibles and the second set of crucibles includes two crucibles. In a further example, the first set of evaporation crucibles and the second set of evaporation crucibles may each include seven crucibles.

In FIG. 6, the first line 120, along which the first set 110 of crucibles is arranged, and the second line 190, along which the second set 180 of crucibles is arranged, are displaced from each other in a displacement direction, e.g. the y-direction shown in FIG. 6. For instance, the displacement direction may be substantially perpendicular to the first direction along which the first line and the second line run.

For instance, the displacement of the first line to the second line may be in the range of between 20 mm and 130 mm, particularly between 40 mm and about 80 mm, more particularly between about 60 mm and about 80 mm.

In the embodiment shown in FIG. 6, the crucibles 181, 182, 183 of the second set 180 of crucibles are also displaced in the first direction compared to the crucibles 111, 112, 113, 114 of the first set 110 of crucibles. According to some embodiments, the displacement of the crucibles of the first set of crucibles compared to the second set of crucibles in the first direction may be in the range of between 0 mm to about 80 mm, particularly between 0 mm and about 60 mm, more particularly between 0 mm and about 40 mm. Accordingly, it is to be understood that a displacement of 0 mm between the crucibles of the first set of crucibles and the second set of crucibles leads to a situation in which the crucibles of the first set of crucibles and the crucibles of the second set of crucibles are in contact with each other.

With exemplary reference to FIG. 8, according to embodiments which can be combined with any other embodiment described herein, the first line 120 along which the crucibles of the first set 110 of crucibles are arranged and the second line 190 along which the crucibles of the second set 180 of crucibles are arranged may be displaced with respect to each other in a substantially vertical direction, e.g. the z-direction as exemplarily shown in FIG. 8. For instance, the first line 120 and the second line 190 may be vertically displaced with respect to each other by a distance selected from a range between 0 mm to about 80 mm, particularly between 0 mm and about 60 mm, more particularly between 0 mm and about 40 mm.

In the embodiments shown in FIGS. 6 to 8, the crucibles can be described as being arranged in a staggered manner due to the displacement of the first line and the second line in the displacement direction, e.g. the y-direction, and in particular due to the additional displacement of the crucibles of the first set and the crucibles of the second set in the first direction e.g. the x-direction. It has been found that a staggered arrangement of the crucibles may be beneficial for the production of high quality gradient layers, particularly with respect to the homogeneity of the optical appearance and the control of barrier properties.

According to embodiments which can be combined with any other embodiment described herein, the gas supply pipe is adapted for ensuring an almost constant gas supply through the outlets along the first direction from the first outlet to the last outlet of the gas supply pipe. For instance, the size of the outlets may be adapted to the diameter of the gas supply pipes. For example, the outlet size may increase for an increasing pipe diameter. According to some embodiments, the gas supply pipe and the outlets may be configured to be used in a vacuum environment. In particular, the gas supply pipe and the outlets may be configured to deliver a constant gas supply over the width of the flexible substrate to be coated in the first direction under vacuum conditions.

According to embodiments which can be combined with any other embodiment described herein, the diameter of the gas supply pipe as described herein may be between 10 mm and 30 mm, particularly between 12 mm and 20 mm, more particularly between 12 mm and 18 mm. In some embodiments which can be combined with other embodiments described herein, the diameter of the outlets in the gas supply pipe may be between 0.5 mm and 1.5 mm, particularly between 0.6 mm and 1.2 mm, more particularly between 0.6 mm and 1.0 mm. In one example, the evaporation apparatus is adapted for coating substrates having a width of up to 2450 mm, and includes a gas supply pipe having a diameter of 12 mm with a plurality of outlets having a diameter of 0.6 mm.

Figure 9:
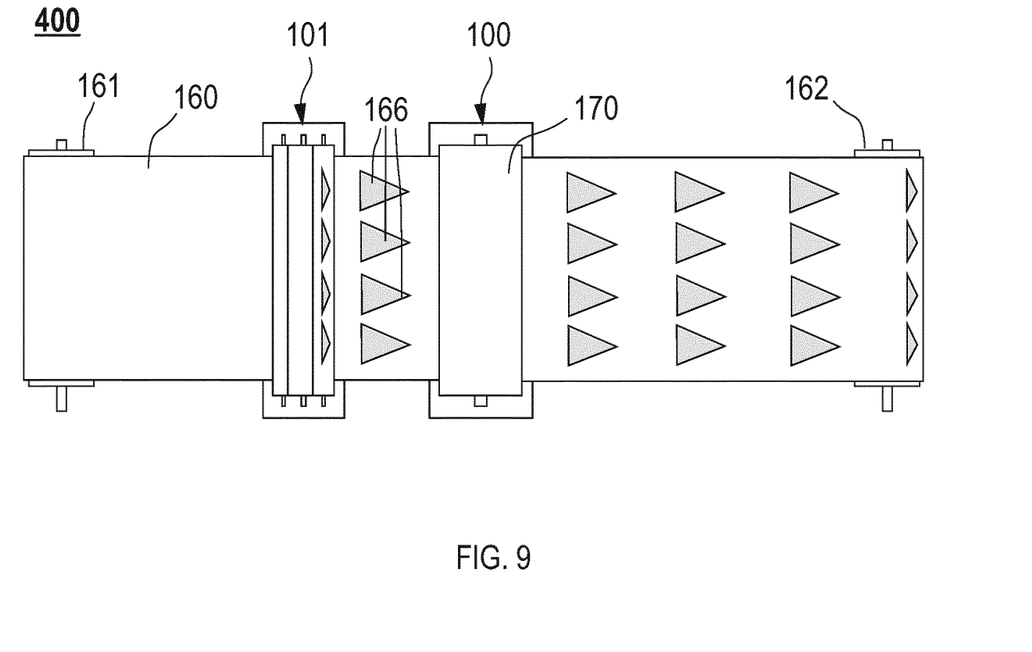
FIG. 9 shows a schematic view of the evaporation apparatus according to yet further embodiments described herein.

With exemplary reference to FIG. 9, an evaporation system 400 is described. In particular, according to embodiments which can be combined with any other embodiments described herein, the evaporation system 400 may include an evaporation according to any of the embodiments described herein as well as an oil printing module 101 configured for printing a patterned oil layer on the flexible substrate. Further, as exemplarily shown in FIG. 9, typically the evaporation system 400 includes a supply drum 161 for providing the flexible substrate to be coated and a take-up drum 162 for storing the substrate after coating. In particular, for producing a patterned gradient layer as exemplarily shown in FIG. 10, the evaporation system 400 is configured such that the flexible substrate to be coated is at first guided through the oil printing module 101 before the substrate is subsequently guided through the evaporation apparatus 100. For instance, the oil printing module 101 can be configured such that that the printed oil on the flexible substrate is evaporated when the flexible substrate is subsequently guided through the evaporation apparatus 100.

Accordingly, areas on the flexible substrate from which the oil evaporates during deposition of evaporated material on the flexible substrate in the evaporation apparatus may be coated with less material than areas which have not been printed with oil. Accordingly, by employing an evaporation apparatus as described herein in combination with an oil printing module 101, a patterned gradient layer as exemplarily shown in FIG. 10 can be produced. In particular, the evaporation apparatus 100 may be configured such that during deposition of a first composition, e.g. aluminum (Al), only oil-free areas on the flexible substrate are coated with the first composition while the oil on the oil-printed areas evaporates such that in a subsequent deposition of a second composition, e.g. aluminum oxide (AlOx), a patterned gradient layer can be produced. For instance, with exemplary reference to FIG. 10, patterned gradient layer may include areas with a gradient of the first composition and the second composition, e.g. Al/AlOx, and areas with only the second composition, e.g. AlOx. According to one example, the position of the gas supply (e.g. the position of oxygen supply) as well as the rate of evaporated material of the first composition (e.g. aluminum) may be adjusted to produce an aluminum barrier coating with a thickness of 40 nm followed by a coating of the second composition (e.g. aluminum oxide) with a thickness of 10 nm to 20 nm.

Figure 10:
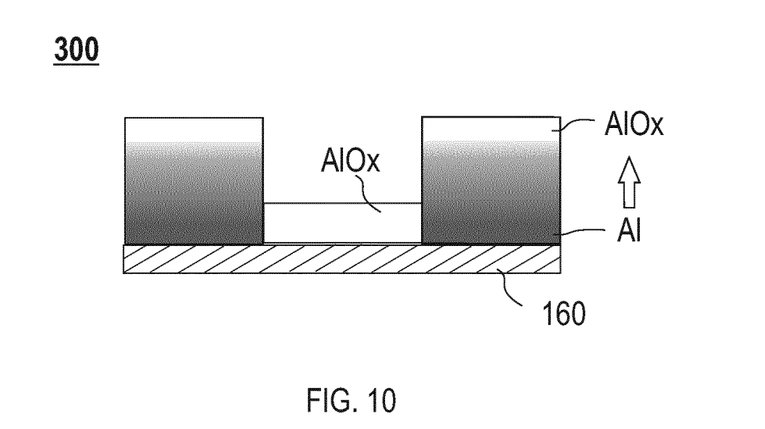
FIG. 10 shows an exemplary schematic sectional view of a patterned gradient layer obtainable by a method for manufacturing a gradient layer according to embodiments described herein.

Accordingly, with exemplary reference to FIGS. 9 and 10, it is to be understood that by providing an evaporation system 400 having an evaporation apparatus 100 in combination with an oil printing module 101 as described herein, a patterned gradient layer as exemplarily shown in FIG. 10 may be produced, in which the non-printed area, i.e. the oil-free area, on the substrate may be coated with an Al-barrier layer and subsequently a protective AlOx top layer can be applied which may be beneficial for improving the durability of the coating. Thus, a patterned gradient layer with areas of AlOx and areas with an Al/AlOx gradient can be produced, as exemplarily shown in FIG. 10. For instance, the areas of AlOx can be transparent in order to provide a window area on the flexible substrate. Further, it is to be understood that the evaporation system 400 as described herein is configured for depositing a patterned barrier layer, particularly a patterned gradient layer with barrier properties, in one continuous process without the need for an additional lamination, e.g. for providing the protective top coating. Accordingly, a patterned gradient layer with barrier properties can be produced in a cost-efficient manner.

In view of the embodiments described herein, it is to be understood that the herein described evaporation apparatus may be used in an evaporation system including a supply drum for providing the substrate to be coated and a take-up drum for storing the substrate after coating. According to embodiments which can be combined with any other embodiment described herein, the evaporation system may include further components, such as further drums or rolls for guiding and/or tensioning the substrate to be coated, cooling devices for cooling the substrate during the deposition process, a control unit for monitoring and controlling the operation of the evaporation system, closed-loop automatic layer control, self-diagnostic out-of-range monitoring, high rate evaporation sources, and the like. In one embodiment, the evaporation system, in which the evaporation apparatus according to embodiments described herein may be used, may be adapted for avoiding contact of the coated side of the substrate with components of the system, such as guiding and tensioning rolls. Typically, the evaporation apparatus described herein may be an evaporation apparatus suitable for being used in a vacuum deposition process. The evaporation apparatus may include components for maintaining a vacuum during operation, such as high-performance pumping systems, vacuum pumps, seals, and the like. Further, the evaporation apparatus and the oil printing module may be configured for being used in an evaporation system for flexible substrates to be coated over a width ranging from about 650 mm to about 4500 mm. Typically, the evaporation apparatus and the oil printing module may be adapted for guiding the substrate with a speed of up to 17 meters-per-second.

Figure 11A:
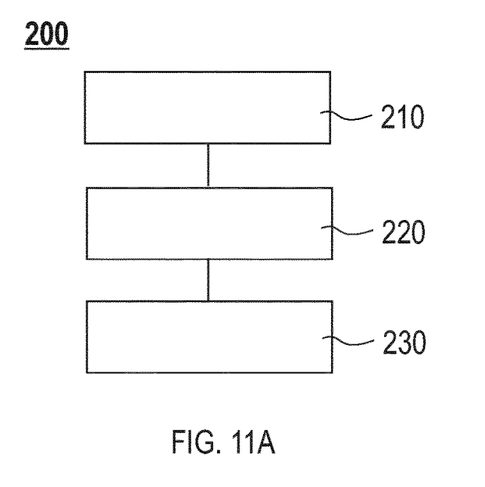
FIGS. 11A to 11C show block diagrams illustrating embodiments of a method for manufacturing a gradient layer having a first composition and a second composition according to embodiments described herein.
Figure 11B:
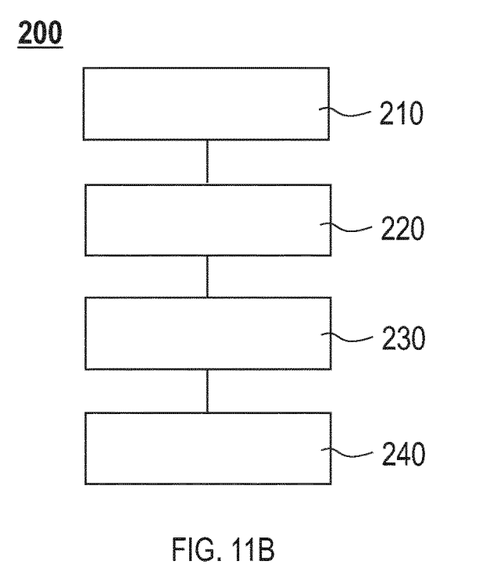
Figure 11C:
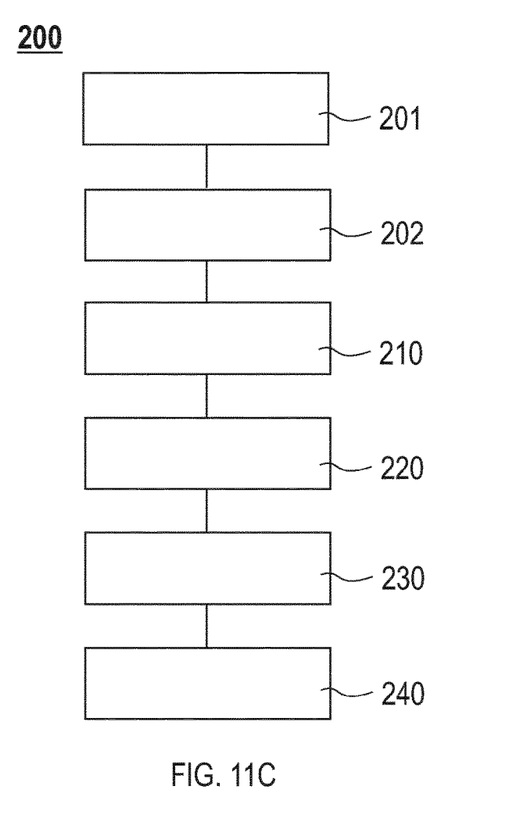

With exemplarily reference to the block diagrams shown in FIGS. 11A to 11C, embodiments of a method 200 for manufacturing a gradient layer are described. In particular, the method 200 for manufacturing a gradient layer according to embodiments described herein can be employed for manufacturing a gradient layer having a first composition and a second composition. According to embodiments which can be combined with any other embodiments described herein, the method 200 for manufacturing a gradient layer includes evaporating 210 material with the first composition from a first set 110 of evaporation crucibles aligned in a first line 120 along a first direction such that a cloud 151 of evaporated material is generated for depositing the material on a flexible substrate 160 supported by a processing drum 170. Further, as exemplarily illustrated by the block diagram shown in FIG. 11A, the method 200 further includes providing 220 a gas supply directed into the cloud 151 of evaporated material through the plurality of outlets 133 of the gas supply pipe 130 for generating the second composition; and adjusting 230 a gradient of the second composition of the gradient layer by adjusting a position of the gas supply directed into the cloud 151 of evaporated material.

According to some embodiments, the evaporation process, i.e. evaporating 210 material with the first composition, takes places in a vacuum atmosphere, such as at a pressure of several $10^{-4}$ hPa to several $10^{-3}$ hPa. The skilled person will understand that the supply of gas from the gas supply pipe does not substantially amend the pressure during the evaporation process as the gas is bonded by the material formed as deposited layer. Further, according to embodiments which can be combined with any other embodiment described herein, providing 220 a gas supply directed into the cloud of evaporated material includes providing a gas flow in the gas supply pipe. Typically, the gas flow provided in the gas supply pipe depends on the size of the evaporation apparatus and the size of the substrate to be coated. For instance, the evaporation apparatus may be configured for coating a substrate having a coating width in the first direction of between 1200 mm to about 4500 mm, particularly between 1250 mm and about 4450 mm, for instance 2450 mm. The gas supply pipe may be configured to provide a gas flow of between 5000 sccm and 50000 sccm, particularly between 7000 sccm and 35000 sccm, more particularly between 7000 sccm and 20000 sccm.

According to embodiments which can be combined with any other embodiments described herein, evaporating 210 material with the first composition includes evaporating aluminum Al such that a cloud of evaporated aluminum Al is generated for depositing aluminum Al on the substrate.

According to embodiments which can be combined with any other embodiments described herein, providing 220 the gas supply directed into the cloud of evaporated material includes providing oxygen $O_2$ for generating the second composition of the gradient layer, particularly by oxidation of the first composition.

With exemplarily reference to the block diagram shown in FIG. 11B, according to embodiments which can be combined with any other embodiments described herein, the method 200 further includes evaporating 240 material with the first composition from a second set 180 of evaporation crucibles aligned in a second line 190 along the first direction for generating a further cloud 152 of evaporated material to be deposited on the substrate.

According to embodiments which can be combined with any other embodiments described herein, adjusting 230 the gradient of the second composition of the gradient layer comprises increasing a content of the second composition by positioning the gas supply directed into cloud of evaporated material in a central region between a rotational axis of the processing drum and an evaporation crucible of the first set of evaporation crucibles.

According to embodiments which can be combined with any other embodiments described herein, adjusting 230 the gradient of the second composition of the gradient layer comprises decreasing a content of the second composition by positioning the gas supply directed into the cloud of evaporated material in a lateral edge region between the processing drum and an evaporation crucible of the first set of evaporation crucibles.

With exemplary reference to FIG. 11C, according to embodiments which can be combined with any other embodiments described herein, the method for manufacturing a gradient layer may further include further printing 201 an oil layer on the substrate, particularly a patterned oil layer, and evaporating 202 the oil layer when the material with the first composition is evaporated.

In view of the embodiments as described in the present disclosure, the skilled person understands that embodiments of the evaporation apparatus, of the evaporation system as well as of the method for manufacturing a gradient layer as described herein are particularly well suited for controlling and adjusting physical properties, e.g. barrier properties and/or optical properties, of a gradient layer deposited on a flexible substrate, particularly used in packaging applications. In particular, with embodiments as described herein, high-quality layers with improved durability can be deposited on flexible substrates at low costs due to the fact that the gradient layer with the desired properties can be produced in one continuous process step without the need for additional lamination as conventionally done.

Further, the embodiments as described herein provide for controlling the optical appearance of coated substrates by adjusting the gradient of a gradient layer deposited on the substrate as described herein. In particular, the gradient of a gradient layer having a first composition and the second composition can be adjusted by controlling the respective amounts of first composition and the second composition in the gradient layer. Accordingly, it is to be understood that the overall property of the gradient layer can be designed within the margin of the material properties of the individual employed compositions, i.e. the first composition being Al and the second composition being AlOx. Particularly, the embodiments of the evaporation apparatus, of the evaporation system and of the method for manufacturing a gradient layer as described herein are beneficially employed for producing a gradient layer having improved durability and barrier properties wherein also the optical color appearance and or the metallic optical appearance can be adjusted by the thickness and the refractive index of the second composition, e.g. AlOx, provided in the gradient layer. Moreover, embodiments as described herein provide for the possibility of producing gradient layers on flexible substrates with transparent areas, which may be beneficial for packaging applications in which a product packed in such a coated substrate should be visible from the outside.

The invention claimed is:

1. An evaporation apparatus for depositing material on a flexible substrate supported by a processing drum, the evaporation apparatus comprising:
    a first set of evaporation crucibles aligned in a first line along a first direction for generating a cloud of evaporated material to be deposited on the flexible substrate; and
    a gas supply pipe coupled to an actuator, the gas supply pipe extending in the first direction and being arranged between an evaporation crucible of the first set of evaporation crucibles and the processing drum,
    wherein the gas supply pipe comprises a plurality of outlets for providing a gas supply directed into the cloud of evaporated material, and
    wherein a position of the plurality of outlets is adjustable for changing a position of the gas supply directed into the cloud of evaporated material,
    wherein the position of the gas supply is adjustable by relocating the gas supply pipe within a plane being perpendicular to the first direction relative to an initial position of the gas supply pipe and by rotating the gas supply pipe around a longitudinal axis of the gas supply pipe.

2. The evaporation apparatus according to claim 1, wherein the first line of the first set of evaporation crucibles is defined through the center of at least two of the evaporation crucibles in the first set of evaporation crucibles, wherein the position of the gas supply is adjustable in a second direction being different from the first direction, and wherein the second direction is perpendicular to the first line.

3. The evaporation apparatus according to claim 1, wherein the position of the gas supply is adjustable within the plane being perpendicular to the first direction within a positioning range of ±80 mm.

4. The evaporation apparatus according to claim 1, further comprising a second set of evaporation crucibles aligned in a second line along the first direction for generating a further cloud of evaporated material to be deposited on the flexible substrate, and the second line of the second set of evaporation crucibles is defined through the center of at least two of the evaporation crucibles in the second set of evaporation crucibles, wherein the first line and the second line are displaced with respect to each other in a direction substantially perpendicular to the first direction.

5. The evaporation apparatus according to claim 4, wherein the first line and the second line are displaced to each other in a range of between 20 mm and 90 mm.

6. The evaporation apparatus according to claim 4, wherein the first set of evaporation crucibles and the second set of evaporation crucibles are arranged in a staggered manner.

7. An evaporation system comprising an evaporation apparatus and an oil printing module configured for printing a patterned oil layer on a flexible substrate, the evaporation apparatus being an evaporation apparatus for depositing material on a flexible substrate supported by a processing drum, the evaporation apparatus comprising:
    a first set of evaporation crucibles aligned in a first line along a first direction for generating a cloud of evaporated material to be deposited on the flexible substrate; and
    a gas supply pipe coupled to an actuator, the gas supply pipe extending in the first direction and being arranged between an evaporation crucible of the first set of evaporation crucibles and the processing drum,
    wherein the gas supply pipe comprises a plurality of outlets for providing a gas supply directed into the cloud of evaporated material, and
    wherein a position of the plurality of outlets is adjustable for changing a position of the gas supply directed into the cloud of evaporated material,
    wherein the position of the gas supply is adjustable by relocating the gas supply pipe within a plane being perpendicular to the first direction relative to an initial position of the gas supply pipe and by rotating the gas supply pipe around a longitudinal axis of the gas supply pipe.

8. The evaporation apparatus according to claim 2, wherein the second direction is a horizontal direction.

9. The evaporation apparatus according to claim 1, wherein the position of the gas supply is adjustable within a plane being perpendicular to the first direction within a positioning range of ±60 mm.

10. The evaporation apparatus according to claim 4, wherein the first line and the second line are displaced to each other in a range of between 40 mm and about 80 mm.

11. An evaporation apparatus for depositing material on a substrate, comprising:
    a first set of evaporation crucibles aligned in a first line along a first direction for generating evaporated material; and
    a gas supply pipe coupled to an actuator configured to move the gas supply pipe, the gas supply pipe being arranged between an evaporation crucible of the first set of evaporation crucibles and a substrate,
    the actuator being configured to relocated the gas supply pipe within a plane perpendicular to the first direction and configured to rotate the gas supply pipe about a longitudinal axis of the gas supply pipe.

12. The evaporation apparatus of claim 11, the gas supply pipe further comprising a plurality of adjustable outlets extending in the first direction.

13. The evaporation apparatus of claim 11, the first line of the first set of evaporation crucibles is defined through the center of at least two of the evaporation crucibles in the first set of evaporation crucibles, the position of the gas supply pipe being adjustable in a second direction different from the first direction.

14. The evaporation apparatus of claim 11, the position of the gas supply pipe being adjustable within the plane being perpendicular to the first direction within a positioning range of +/−80 mm.

15. The evaporation apparatus of claim 11 further comprising a second set of evaporation crucibles aligned in a second line along the first direction, and the second line of the second set of evaporation crucibles is defined through the center of at least two of the evaporation crucibles in the second set of evaporation crucibles, the first line and the second line being displaced with respect to each other in a direction substantially perpendicular to the first direction.

* * * * *

UNITED STATES PATENT AND TRADEMARK OFFICE
CERTIFICATE OF CORRECTION

PATENT NO. : 11,058,010 B2
APPLICATION NO. : 16/318812
DATED : July 6, 2021
INVENTOR(S) : Roland Trassl Page 1 of 1

It is certified that error appears in the above-identified patent and that said Letters Patent is hereby corrected as shown below:

On the Title Page

Column 1, under (73) Assignee: delete "Applied Materials Inc., Santa Clara, CA (US)" and insert
-- Applied Materials Web Coating GMBH, Alzenau, Germany. --

Signed and Sealed this
Sixth Day of September, 2022

Katherine Kelly Vidal
*Director of the United States Patent and Trademark Office*